(12) United States Patent
Lee et al.

(10) Patent No.: US 12,327,826 B2
(45) Date of Patent: Jun. 10, 2025

(54) SEMICONDUCTOR PACKAGE

(71) Applicant: Samsung Electronics Co., Ltd., Suwon-si (KR)

(72) Inventors: Yongkoon Lee, Suwon-si (KR); Myungsam Kang, Hwaseong-si (KR); Youngchan Ko, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 385 days.

(21) Appl. No.: 17/721,745

(22) Filed: Apr. 15, 2022

(65) Prior Publication Data

US 2023/0016061 A1  Jan. 19, 2023

(30) Foreign Application Priority Data

Jul. 19, 2021  (KR) .................. 10-2021-0094047

(51) Int. Cl.
| | |
|---|---|
| *H01L 25/16* | (2023.01) |
| *H01L 23/00* | (2006.01) |
| *H01L 23/053* | (2006.01) |
| *H01L 23/31* | (2006.01) |
| *H01L 23/538* | (2006.01) |
| *H01L 23/552* | (2006.01) |
| *H01L 23/66* | (2006.01) |

(52) U.S. Cl.
CPC ............ *H01L 25/16* (2013.01); *H01L 23/053* (2013.01); *H01L 23/3114* (2013.01); *H01L 23/5383* (2013.01); *H01L 23/552* (2013.01); *H01L 23/66* (2013.01); *H01L 24/16* (2013.01); *H01L 2223/6677* (2013.01); *H01L 2224/16157* (2013.01)

(58) Field of Classification Search
None
See application file for complete search history.

(56) References Cited

U.S. PATENT DOCUMENTS

| | | | | |
|---|---|---|---|---|
| 11,527,495 | B2* | 12/2022 | Kang | .................. H01L 23/3128 |
| 11,935,849 | B2* | 3/2024 | Kang | .................. H01L 23/5386 |
| 2019/0067219 | A1* | 2/2019 | Lasiter | .................. H01L 23/66 |
| 2021/0398923 | A1* | 12/2021 | Kang | .................. H01L 23/5389 |

* cited by examiner

*Primary Examiner* — Long Pham
(74) *Attorney, Agent, or Firm* — Harness, Dickey & Pierce, P.L.C.

(57) ABSTRACT

A semiconductor package includes an antenna structure including an antenna member configured to transmit and receive a signal through the first surface in the dielectric layer, a connection via extending from the antenna member toward the second surface, and a ground member spaced apart from the connection via; a frame surrounding the side surface of the antenna structure; a first encapsulant covering at least a portion of the antenna structure and the frame; a redistribution structure on the second surface and including an insulating layer in contact with the antenna structure and the frame, and a redistribution conductor configured to be electrically connected to the ground member and the connection via in the insulating layer; a first semiconductor chip on the redistribution structure and electrically connected to the antenna member through the redistribution conductor; a second encapsulant encapsulating the first semiconductor chip on the redistribution structure; and a shielding layer surrounding a surface of the second encapsulant.

20 Claims, 17 Drawing Sheets

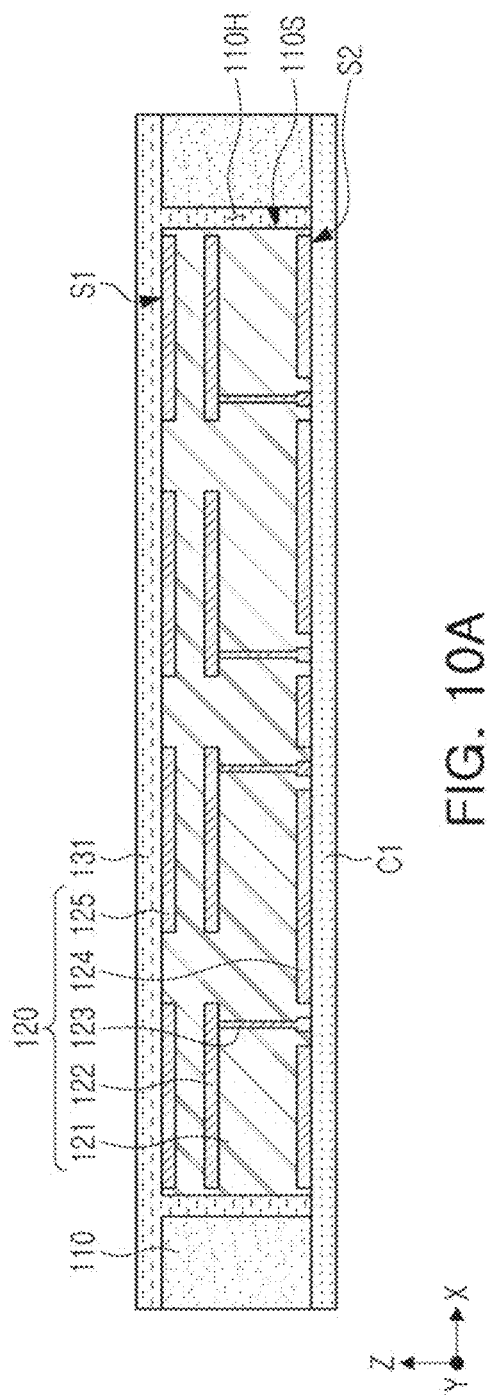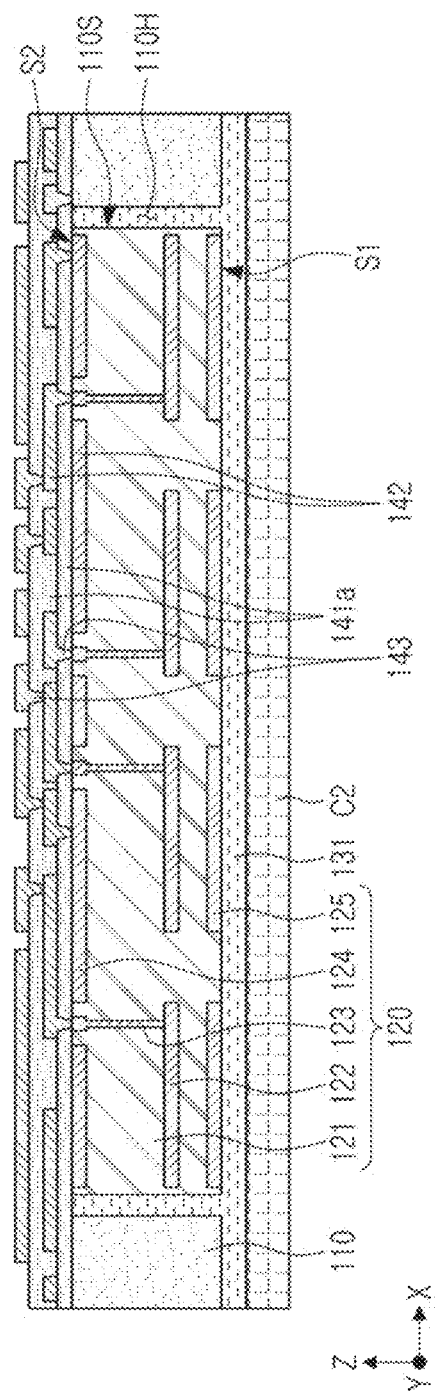

SEMICONDUCTOR PACKAGE

CROSS TO REFERENCE TO RELATED APPLICATION(S)

This application claims benefit of priority to Korean Patent Application No. 10-2021-0094047 filed on Jul. 19, 2021, in the Korean Intellectual Property Office, the disclosure of which is incorporated herein by reference in its entirety.

BACKGROUND

Example embodiments of the present disclosure relate to a semiconductor package.

With respect to millimeter wave (mmWave) communications including 5G communication, a semiconductor package in which an antenna and other electronic components (e.g., an RFIC, a PMIC, a passive device, and/or the like) required for 5G communication are integrated and loss of high-frequency signals is reduced may be advantageous.

SUMMARY

Example embodiments of the present disclosure provide a semiconductor package in which transmission loss between an antenna and an RFIC is reduced.

In example embodiments of the present disclosure, a semiconductor package includes an antenna structure having a first surface, a second surface opposite to the first surface, and a side surface between the first and second surfaces, and including a dielectric layer, an antenna member configured to transmit and receive a signal through the first surface in the dielectric layer, a connection via extending from the antenna member toward the second surface, and a ground member adjacent to the second surface in the dielectric layer, and spaced apart from the antenna member and the connection via; a frame surrounding the side surface of the antenna structure; a first encapsulant covering at least a portion of the antenna structure and the frame; a redistribution structure on the second surface and including an insulating layer in contact with the antenna structure and the frame, and a redistribution conductor configured to be electrically connected to the ground member and the connection via in the insulating layer; a first semiconductor chip on the redistribution structure and electrically connected to the antenna member through the redistribution conductor; a second encapsulant encapsulating the first semiconductor chip on the redistribution structure; and a shielding layer surrounding a surface of the second encapsulant.

In example embodiments of the present disclosure, a semiconductor package includes an antenna structure having a first surface, a second surface opposite to the first surface, and a side surface between the first and second surfaces, and including a dielectric layer, an antenna member configured to transmit and receive a signal through the first surface, a connection via extending from the antenna member toward the second surface, and a ground member adjacent to the second surface in the dielectric layer, and spaced apart from the antenna member and the connection via; a redistribution structure on the second surface and including an insulating layer in contact with the antenna structure, and a redistribution conductor configured to be electrically connected to the ground member and the connection via in the insulating layer; a first encapsulant covering the first surface and the side surface of the antenna structure; a semiconductor chip disposed on the redistribution structure opposite to the antenna structure and electrically connected to the redistribution conductor; and a second encapsulant encapsulating the semiconductor chip, wherein the redistribution structure has a fan-in area overlapping the antenna structure in a direction perpendicular to the second surface and a fan-out area extending to an external side of the fan-in area.

In example embodiments of the present disclosure, a semiconductor package includes an antenna structure having a first surface, a second surface opposite to the first surface, and a side surface between the first and second surfaces, and including a dielectric layer, an antenna member configured to transmit and receive a signal through the first surface, a connection via extending from the antenna member toward the second surface, and a ground member adjacent to the second surface in the dielectric layer and spaced apart from the antenna member and the connection via; a redistribution structure on the second surface and including an insulating layer on the dielectric layer, a redistribution pattern on the insulating layer, and a redistribution via penetrating the insulating layer and electrically connecting the redistribution pattern to the ground member and the antenna member; first and second semiconductor chips on the redistribution structure opposite to the antenna structure and electrically connected to the redistribution pattern, wherein the connection via has a shape in which side surfaces opposing each other extend substantially in parallel, and wherein the redistribution via has a shape in which side surfaces opposing each other are tapered toward the second surface.

BRIEF DESCRIPTION OF DRAWINGS

The above and other aspects, features, and advantages of the present disclosure will be more clearly understood from the following detailed description, taken in conjunction with the accompanying drawings, in which:

FIGS. 10A to 10E are cross-sectional diagrams illustrating processes of manufacturing the semiconductor package illustrated in FIG. 1A in order.

DETAILED DESCRIPTION

Hereinafter, example embodiments of the present disclosure will be described as follows with reference to the accompanying drawings.

Figure 1A:
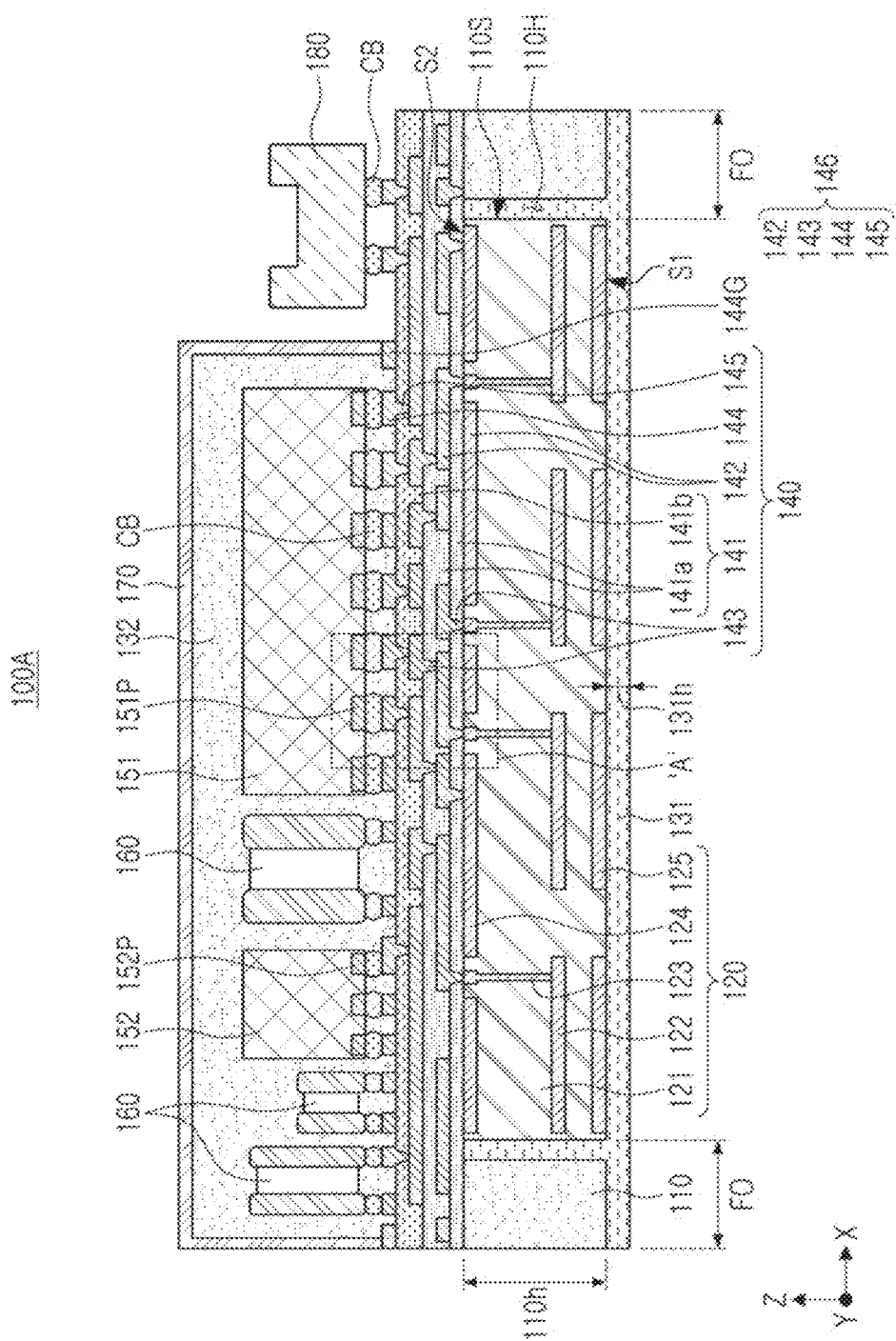
FIG. 1A is a cross-sectional diagram illustrating a semiconductor package according to example embodiments of the present disclosure.
Figure 1B:
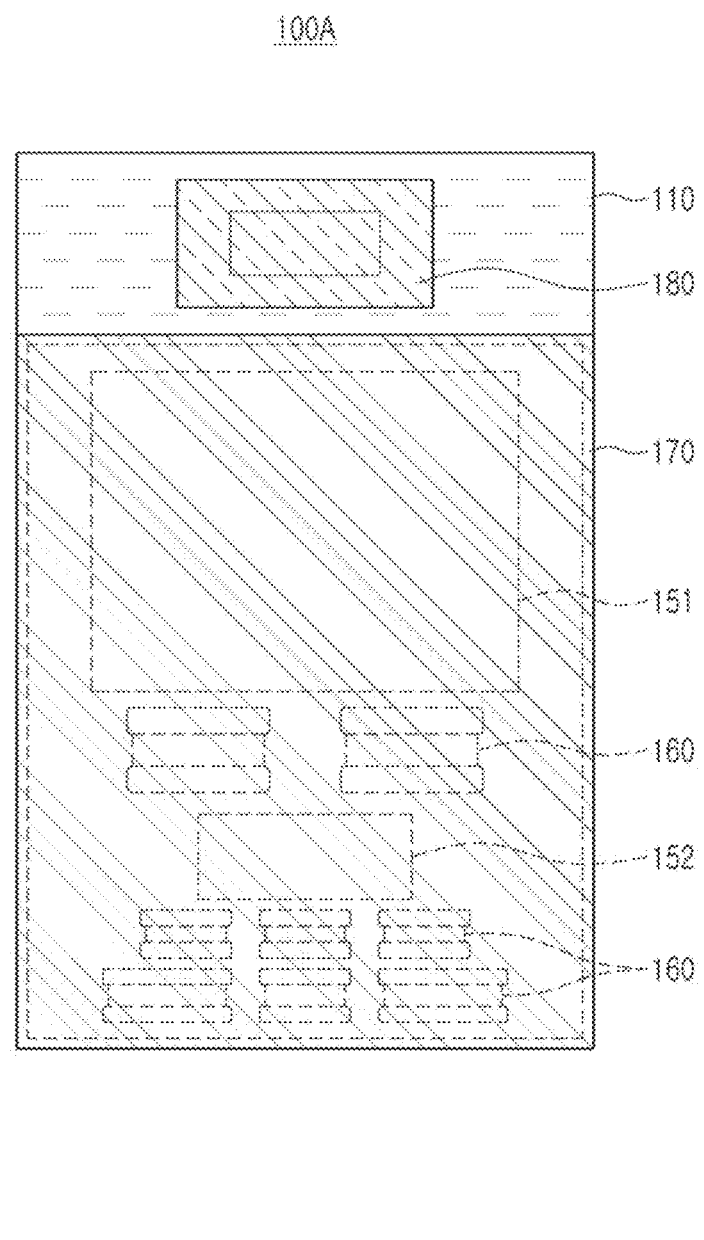
FIGS. 1B and 1C are plan diagrams illustrating an upper surface and a lower surface of the semiconductor package illustrated in FIG. 1A, respectively.
Figure 1C:
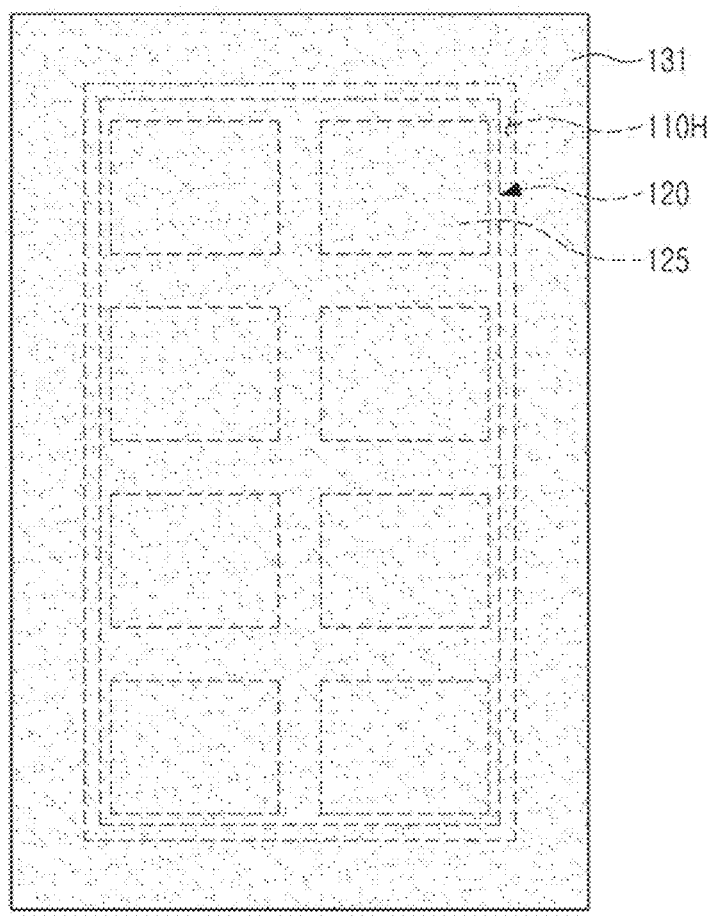

FIG. 1 is a cross-sectional diagram illustrating a semiconductor package 100A according to example embodiments. FIGS. 1B and 1C are plan diagrams illustrating an upper surface and a lower surface of the semiconductor package 100A illustrated in FIG. 1A, respectively.

Referring to FIGS. 1A to 1C, a semiconductor package 100A according to example embodiments may include a frame 110, an antenna structure 120, first and second encapsulants 131 and 132, a redistribution structure 140, at least one semiconductor chip 151 and 152, and/or a shielding layer 170. Also, in example embodiments, the semiconductor package 100A may further include a passive device 160 and a connector 180. In some example embodiments, the antenna structure 120 may be packaged in a fan-out form, and the first semiconductor chip 151 (e.g., an RFIC) may be surface-mounted on the redistribution structure 140 of the semiconductor package 100A, such that a transmission line (e.g., a feed line) between the antenna structure 120 and the semiconductor chip 151 may be configured as a redistribution conductor 146 having a fine pitch. Accordingly, a thickness of the semiconductor package 100A may be reduced and/or a length of the transmission line between the antenna structure 120 and the first semiconductor chip 151 may be reduced. Also, transmission loss of a high frequency signal (e.g., a millimeter wave signal) between the antenna structure 120 and the semiconductor chip 151 may be reduced by the transmission line having a fine pitch. The configuration will be described in greater detail with reference to FIG. 2.

The frame 110 may be disposed on the redistribution structure 140 to surround the side surface 120S of the antenna structure 120. For example, the frame 110 may have a through hole 110H for accommodating the antenna structure 120. The frame 110 may be disposed in a fan-out area FO of the redistribution structure 140, may improve rigidity of the semiconductor package 100A and/or may control warpage. The fan-out area FO may be defined as an area which does not overlap the antenna structure 120 in the vertical direction (Z axis direction). The frame 110 may have a shape continuously surrounding a side surface 120S of the antenna structure 120 as illustrated in FIG. 1C, but example embodiments thereof are not limited thereto. In example embodiments, a plurality of frames spaced apart from each other may be disposed around the antenna structure 120. The frame 110 may include an insulating material. As an insulating material, a thermosetting resin such as an epoxy resin, a thermoplastic resin such as a polyimide resin, a material in which an inorganic filler and/or a glass fiber (or a glass cloth or a glass fabric) is impregnated in the thermosetting resin or the thermoplastic resin, such as prepreg, Ajinomoto built-up film (ABF), FR-4, bismaleimide triazine (BT), and/or the like, may be used.

Also, the frame 110 may reduce a thickness of the first encapsulant 131 by securing thickness uniformity of the first encapsulant 131. For example, the frame 110 may have the same or substantially the same height as that of the antenna structure 120. For example, the frame 110 may have a height 110$h$ the same or substantially the same as a height of the side surface 110S of the antenna structure 120 in the Z axis direction. The term "substantially the same" may indicate that thickness uniformity of molding resin of an upper portion (fan-in area) and a periphery (fan-out area) of the antenna structure 120 may be secured in a process (e.g., a molding process) of forming the first encapsulant 131. Accordingly, the above example may include the example in which the height 110$h$ of the frame 110 may be relatively smaller or greater than the height of the side surface 110S of the antenna structure 120. For example, the height of the side surface 110S of the antenna structure 120 may be in a range of about 0.1 mm or more, such as, for example, about 0.1 mm to 3 mm, about 0.2 mm to about 2 mm, about 0.3 mm to about 1 mm, or about 0.5 mm to about 1 mm.

The antenna structure 120 may have a first surface S1, a second surface S2 disposed opposite to the first surface S1, and a side surface 110S disposed between the first surface S1 and the second surface S2, and may include a dielectric layer 121, an antenna member 122 configured to transmit and receive a signal (e.g., an RF signal) through the first surface S1 in the dielectric layer 121, a connection via 123 extending from the antenna member 122 toward the second surface S2, and/or a ground member 124 disposed adjacent to the second surface S2 in the dielectric layer 121 and spaced apart from the antenna member 122 and the connection via 123. The antenna structure 120 may be configured to transmit and receive a high-frequency signal (e.g., a millimeter wave signal). In some example embodiments, by forming the redistribution structure 140 for redistributing the antenna structure 120 using a photolithography process, a transmission line between the antenna structure 120 and the first semiconductor chip 151 may be configured as a redistribution conductor 146 of a fine pitch, and accordingly, transmission loss caused by a skin effect of a high-frequency current may be reduced. The dielectric layer 121 of the antenna structure 120 may have a dielectric constant Dk of about 6 or more to reduce transmission loss. Each component of the antenna structure 120 will be described in greater detail with reference to FIGS. 5A and 5B.

The first and second encapsulants 131 and 132 may be disposed on the lower and upper surfaces of the redistribution structure 140, respectively, the first encapsulant 131 may cover at least a portion of the antenna structure 120 and the frame 110, and the second encapsulant 132 may encapsulate at least one of the semiconductor chips 151 and 152 and the passive devices 160. The first and second encapsulants 131 and 132 may include an insulating material, such as, for example, a thermosetting resin such as an epoxy resin, a thermoplastic resin such as a polyimide resin, a material in which the thermosetting resin or the thermoplastic resin is impregnated in a core material such as an inorganic filler and/or a glass fiber, such as prepreg, ABF, FR-4, BT, an epoxy molding compound (EMC). The first and second encapsulants 131 and 132 may include different types of insulating materials. For example, the first encapsulant 131 may include ABF, and the second encapsulant 132 may include EMC. In example embodiments, the frame 110 may be disposed around the antenna structure 120 and may ensure thickness uniformity of the first encapsulant 131, and accordingly, the thickness 131$h$ of the cover area of the first encapsulant 131 covering a signal radiation surface (e.g., the first surface S1) of the antenna structure 120 may be reduced. For example, the first encapsulant 131 may have a cover area covering the first surface S1 of the antenna structure 120, and the cover area may have a height in a range of about 50 μm or less, such as, for example, about 10 μm to about 50 μm, about 10 μm to about 40 μm, or about 20 μm to about 40 μm, in a direction perpendicular to the first surface S1. The first and second encapsulants 131 and 132 may have a dielectric constant Dk relatively lower than that of the dielectric layer 121 of the antenna structure 120.

The redistribution structure 140 may be disposed on the second surface S1 of the antenna structure 120, and may include an insulating layer 141, and a redistribution conductor 146 configured to be electrically connected to the ground member 124 and the connection via 123 in the insulating layer 141. In some example embodiments, since the redistribution structure 140 or the redistribution conductor 146 is formed using a photolithography process, the redistribution structure 140 or the redistribution conductor 146 may be formed with a fine pitch as compared to the antenna member 122 and the connection via 123 of the antenna structure 120 formed by a firing process a high-k material and a conductive paste, and accordingly, loss in the transmission line may be reduced.

The insulating layer 141 may include a plurality of layers in direct contact with the dielectric layer 121, the frame 110, and the first encapsulant 131 of the antenna structure 120 and including the same insulating material or different types of insulating materials. For example, the insulating layer 141 may include at least one or more built-up insulating layers 141a and an outermost insulating layer 141b on the built-up insulating layer 141a. The insulating layer 141 may include a thermosetting resin, a thermoplastic resin, prepreg, ABF, FR-4, BT, or a photosensitive resin such as photoimageable dielectric (PID). For example, the built-up insulating layer 141a may include PID, and the outermost insulating layer 141b may include ABF. When the insulating layer 141 includes PID, the insulating layer 141 may have a thickness less than that in the example in which the above-described other materials are included, and redistribution patterns 142 and redistribution vias 143 may have a reduced thickness. The insulating layer 141 may have a dielectric constant Dk lower than the dielectric constant Dk of the dielectric layer 121 of the antenna structure 120. For example, the insulating layer 141 may have a dielectric constant (Dk) of about 5 or less and a dielectric loss tangent (Df) of about 0.05 or less. For example, the insulating layer 141 may include an insulating layer having a dielectric constant (Dk) in a range of about 1 to about 5, about 2 to about 5, and about 3 to about 4, and a dielectric loss tangent (Df) in a range of about 0.05 to about 0.01, about 0.04 to about 0.01, and about 0.03 to about 0.01. Also, when the insulating layer 141 includes a plurality of layers, a boundary between the insulating layers 141 on different levels may be indistinct depending on processes.

The redistribution conductor 146 may substantially redistribute the antenna member 122 of the antenna structure 120 and the connection pads 151P and 152P of the at least one semiconductor chip 151 and 152, and may provide a signal transmission path disposed between the antenna member 122 and the first semiconductor chip 151 (e.g., an RFIC). When a fine wiring of the semiconductor package is used to connect the antenna to the RFIC, signal loss between the antenna and the RFIC may be reduced and signal integrity (SI) and power integrity (PI) may improve. For example, the redistribution conductor 146 may include a redistribution pattern 142 on the insulating layer 141 and a redistribution vias 143 penetrating the insulating layer 141 and electrically connecting the redistribution pattern 142 to the ground member 124 and the antenna member 122 or to the redistribution patterns 142 disposed on different levels. Also, the redistribution conductor 146 may further include an UBM pad 144 in contact with the connection bump CB on the outermost insulating layer 141b, and an UBM via 145 penetrating the outermost insulating layer 141b and connecting the UBM pad 144 to the redistribution pattern 142 or the pad portion 142P (in FIG. 4A). The UBM pad 144 and the UBM via 145 may be denoted as above to distinguish a portion of the redistribution conductor 146 formed on or in the outermost insulating layer 141b and in contact with the connection bump CB, and in example embodiments, the UBM pad 144 and the UBM via 145 may be configured the same as or similarly to the redistribution pattern 142 and the redistribution via 143. The redistribution conductor 146 may include, for example, a metal material including copper (Cu), aluminum (Al), silver (Ag), tin (Sn), gold (Au), nickel (Ni), lead (Pb), or titanium (Ti), or alloys thereof. The redistribution conductor 146 may perform various functions depending on a design. For example, the redistribution conductor 146 may include a ground pattern, a power pattern, and/or a signal pattern. The redistribution via 143 may be configured as a filled via in which a metal material is filled in the via hole or a conformal via in which a metal material is formed along an inner wall of the via hole.

As described above, in some example embodiments, since the redistribution conductor 146 may be formed using a photolithography process to implement a transmission line disposed between the antenna member 122 and the first semiconductor chip 151 (e.g., RFIC) with a fine pitch, the redistribution via 143 of the redistribution structure 140 may have a shape different from that of the connection via 123 of the antenna structure 120 formed by a firing process. For example, the connection via 123 may have a shape (e.g., a post shape) having side surfaces opposing each other, extending substantially in parallel, and the redistribution via 143 may have side surfaces opposing each other, tapered toward the second surface S2.

At least one semiconductor chip 151 and 152 may be disposed on the redistribution structure 140 opposite to the antenna structure 120, and may include the first semiconductor chip 151 electrically connected to the antenna member 122 through the redistribution conductor 146, and the second semiconductor chip 152 electrically connected to the first semiconductor chip 151 through the redistribution conductor 146. For example, the first semiconductor chip 151 may include a radio-frequency integrated circuit (RFIC) chip for transmitting an RF signal to the antenna structure 120 and receiving an RF signal from the antenna structure 120, and the second semiconductor chip 152 may include a power management integrated circuit (PMIC) chip for controlling power supplied to the first semiconductor chip 151. The first and second semiconductor chips 151 and 152 may be surface-mounted on the redistribution structure 140 and may be encapsulated by a second encapsulant 132. For example, the first and second semiconductor chips 151 and 152 may be electrically connected to the redistribution conductor 146 through the connection bump CB. The connection bump CB may include a metal having a low melting point, such as, for example, tin (Sn) or an alloy (Sn—Ag—Cu) including tin (Sn). The connection bump CB may be configured in the form of a land, a ball, or a pin. For example, the connection bump CB may be configured as a copper pillar or a solder ball.

The passive device 160 may be disposed adjacent to the first and second semiconductor chips 151 and 152 on the redistribution structure 140 and may be electrically connected to the first and second semiconductor chips 151 and 152 through the redistribution conductor 146. The passive device 160 may be provided as a plurality of passive devices 160 if desired. The passive device 160 may provide impedance to the first semiconductor chip 151 and/or the second semiconductor chip 152. For example, the passive device 160 may include at least a portion of a capacitor, an inductor, and a chip resistor. Similarly to the first and second semiconductor chips 151 and 152, the passive device 160 may be surface-mounted on the redistribution structure 140 and may be encapsulated by the second encapsulant 132.

The shielding layer 170 may surround a surface or an external surface of the second encapsulant 132, and may protect electronic components disposed in the second encapsulant 132 from external electromagnetic waves. The shielding layer 170 may be connected to the ground pattern 144G of the redistribution structure 140 and may receive a ground signal. For example, the ground pattern 144G in contact with the shielding layer 170 may be connected to the redistribution conductor 146 in a region not illustrated. The shielding layer 170 may include a metal material such as iron (Fe), copper (Cu), aluminum (Al), silver (Ag), tin (Sn), gold (Au), nickel (Ni), lead (Pb), and titanium (Ti), or alloys thereof. The shielding layer 170 may include a single layer or a plurality of metal material layers. For example, the shielding layer 170 may be configured as a double layer including stainless use steel (SUS) and copper or a triple layer in which SUS, copper, and SUS are stacked in order from the surface of the second encapsulant 132.

The connector 180 may be configured to connect the semiconductor package 100A to an external device, may be spaced apart from the second encapsulant 132 and the shield layer 170 on the redistribution structure 140, and may be electrically connected to the first and second semiconductor chips 151 and 152 through the redistribution conductor 146. The connector 180 may have a structure for connection of a cable (e.g., a coaxial cable, a flexible PCB). The connector 180 may receive an IF signal, a baseband signal, and/or power from a cable, or may provide an IF signal and/or a baseband signal to a cable. The connector 180 may be surface-mounted on the redistribution structure 140.

Hereinafter, the redistribution conductor 146 for reducing transmission loss will be described in greater detail with reference to FIGS. 2 to 4B.

Figure 2:
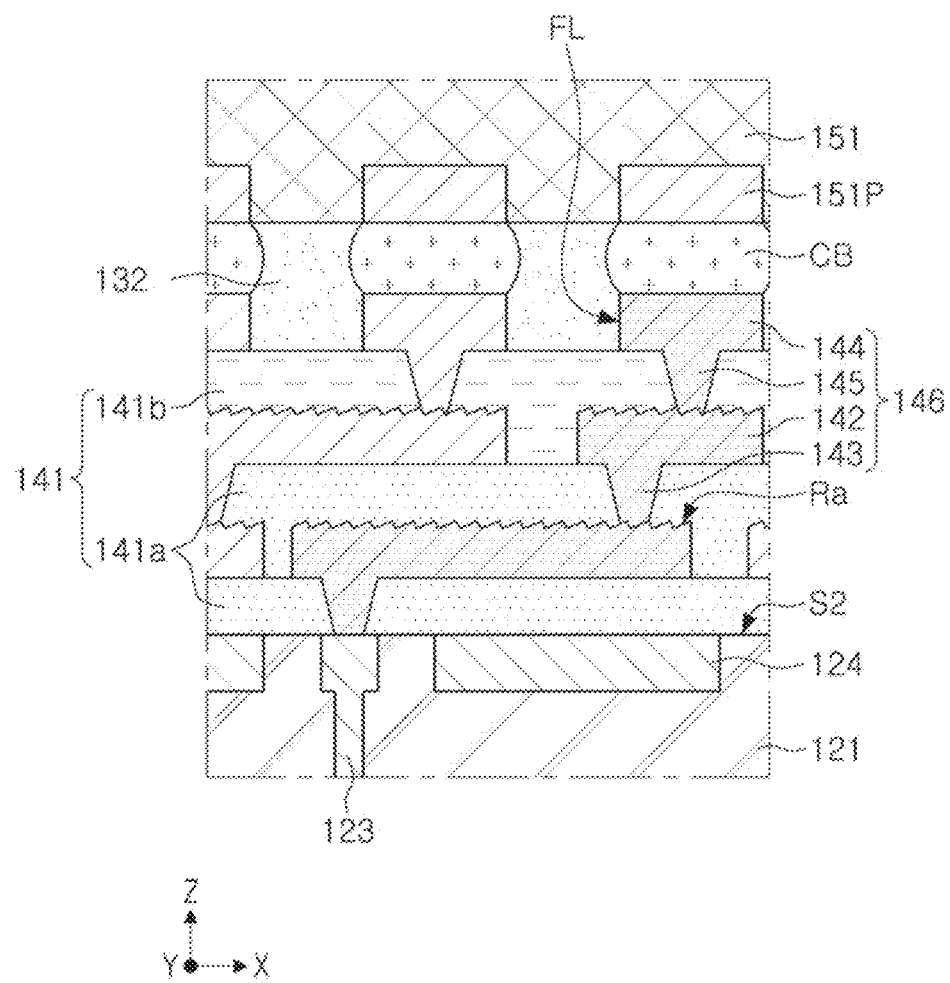
FIG. 2 is an enlarged diagram illustrating region "A" in FIG. 1A.
Figure 3:
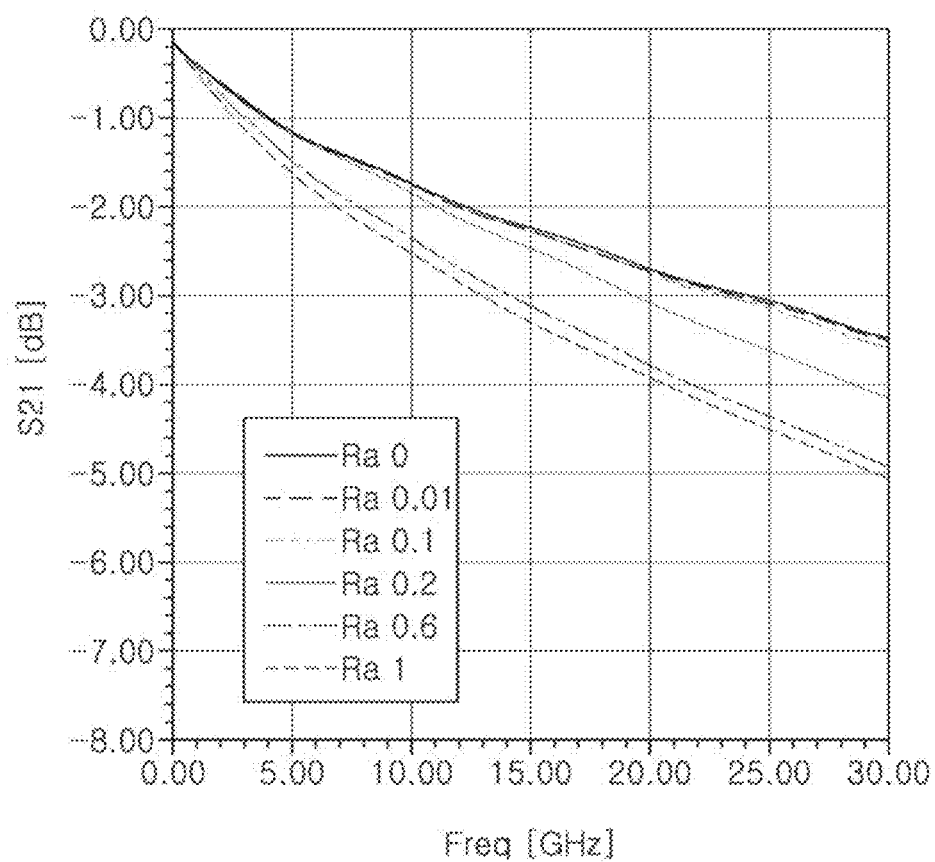
FIG. 3 is a graph illustrating S-parameters for a frequency depending on surface roughness (Ra) of a redistribution pattern.

FIG. 2 is an enlarged diagram illustrating region "A" in FIG. 1A. FIG. 3 is a graph illustrating S-parameters for a frequency depending on surface roughness (Ra) of a redistribution pattern 142. FIG. 3 is a graph illustrating changes in a S-parameter (S21) value according to an increase in the frequency Freq in surface roughness (Ra) of 1, 0.6, 0.2, 0.1, 0.01, and 0 (based on a transmission line under a specific condition). The S-parameter S21 may refer to a ratio of an input signal to an output signal, and transmission loss factor (hereinafter, S21) may increase as the S-parameter S21 becomes a greater negative value.

Referring to FIGS. 2 and 3, in example embodiments, the redistribution conductor 146 included in the transmission line FL disposed between the first semiconductor chip 151 and the connection via 123 may include the redistribution pattern 142, and the redistribution via 143 penetrating the insulating layer 141 and electrically connecting the redistribution pattern 142 to the connection via 123. The redistribution pattern 142 may have surface roughness (Ra) in a range of about 0.1 μm or less, such as, for example, 0.001 μm to 0.1 μm, 0.01 μm to 0.1 μm, 0.01 μm to 0.09 μm, 0.01 μm to 0.08 μm, 0.01 μm to 0.07 μm, 0.01 μm to 0.06 μm, or 0.01 μm to 0.05 μm. As illustrated in FIG. 3, as the surface roughness Ra decreases, the transmission loss factor S21 may decrease, and the increase in the transmission loss factor S21 may decrease in a high frequency region of 25 GHz or higher. As described above, in some example embodiments, the transmission line between the first semiconductor chip 151 and the connection via 123 may be implemented with a fine pitch, and the surface roughness (Ra) of the transmission line may be formed to be about 0.1 μm or less, such that transmission loss caused by a skin effect of high-frequency current may be reduced. In FIG. 2, the surface roughness Ra of the redistribution pattern 142 is exaggerated for ease of description, and the surface roughness of the UBM pad 133 and the ground member 124 is not specifically illustrated.

Figure 4A:
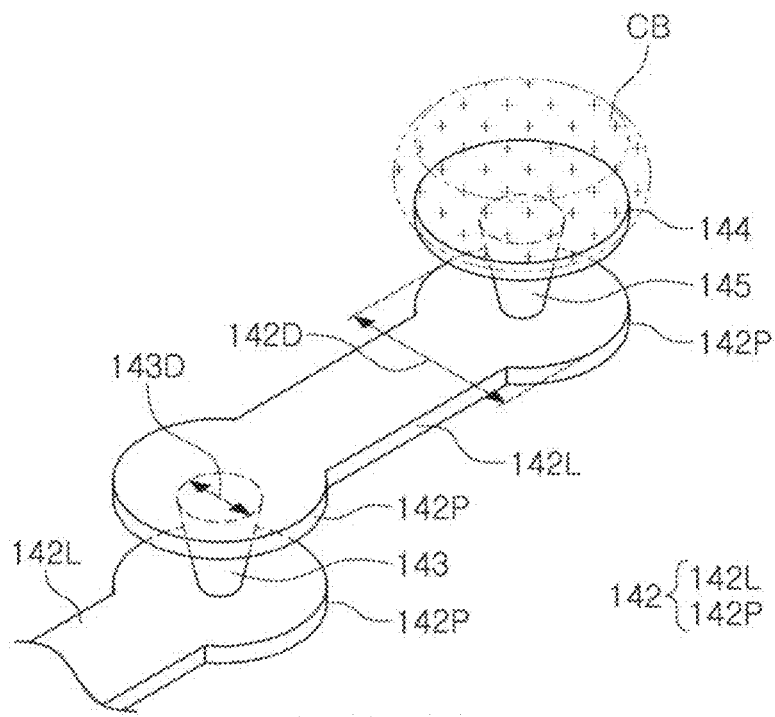
FIG. 4A is a perspective diagram illustrating a coupling relationship between a portion of the elements in FIG. 2.
Figure 4B:
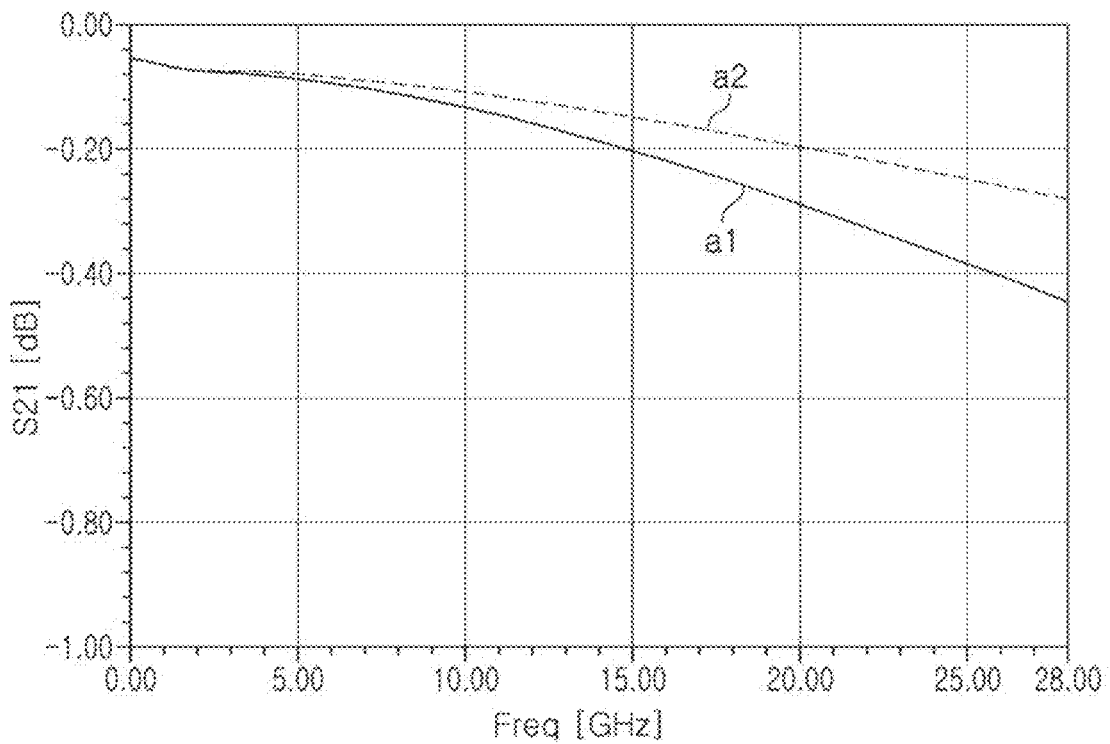
FIG. 4B is a graph illustrating S-parameters for a frequency depending on a size of a pad portion in a solder bonding structure.

FIG. 4A is a perspective diagram illustrating a coupling relationship between a portion of the elements in FIG. 2. FIG. 4B is a graph illustrating S-parameters for a frequency depending on a size of a pad portion 142P in a solder bonding structure. FIG. 4A illustrates a portion of the elements of the redistribution conductor 146 included in the transmission line FL disposed between the first semiconductor chip 151 and the connection via 123. FIG. 4B is a graph illustrating changes in the value of the S-parameter S21 according to an increase in the frequency Freq at the diameter 142D of the pad portion 142P, 150 μm (a1) and 120 μm (a2). The S-parameter S21 may refer to a ratio of an input signal to an output signal, and the transmission loss factor (hereinafter, S21) may increase as the S-parameter S21 becomes a greater negative value.

Referring to FIGS. 4A and 4B, the redistribution conductor 146 in example embodiments may include a redistribution pattern 142 an UBM pad 144, an UBM via 145 disposed below the UBM pad 144, a plurality of pad portions 142P disposed below the UBM via 145 and/or a linear portion 142L connecting the plurality of pad portions 142P to each other on the XY plane, and a redistribution via 143 connecting the plurality of pad portions 142P disposed on different levels to each other. The linear portion 142L may be defined as a portion extending with a line width smaller than the diameter of the pad portion 142P. In some example embodiments, the pad portion 142P may have a diameter 142D in a range of about 150 μm or less, such as, for example, about 40 μm to about 150 μm, about 50 μm to about 150 μm, about 60 μm to about 150 μm, and about 100 μm to about 130 μm. As illustrated in FIG. 4B, when the diameter 142D of the pad portion 142P decreases (a2), the transmission loss ratio S21 may decrease in the solder bonding structure. Also, the effect of reduction in the transmission loss ratio S21 according to the reduction of the diameter 142D of the pad portion 142P may greatly increase in the high frequency region of 25 GHz or higher. As described above, in some example embodiments, by reducing the diameter 142D of the pad portion 142P of the redistribution pattern 142 using a photolithography process, the transmission loss between the surface-mounted first semiconductor chip 151 and the antenna structure 120 may be reduced.

Also, a difference between the diameter 142D of the pad portion 142P and the diameter 143D of the redistribution via 143 may be reduced, such that transmission loss may be further reduced. For example, the diameter 142D of the pad portion 142P may have a ratio of about 3 or less with respect to the maximum diameter 143D of the redistribution via 143, such as, for example, about 1 to about 3, about 1 to about 2.5, and about 1 to about 2.

Figure 5A:
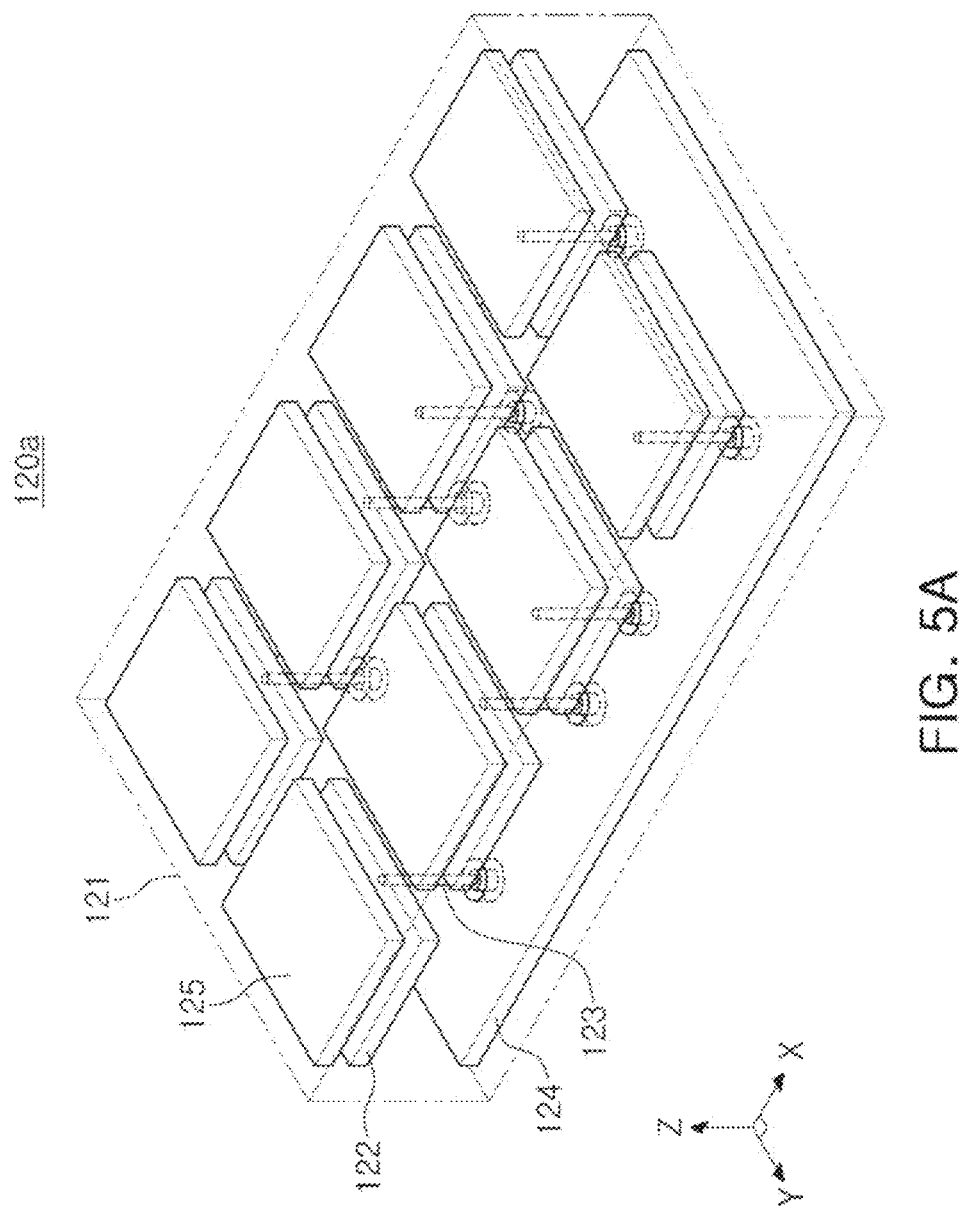
FIGS. 5A and 5B are diagrams illustrating an antenna structure according to example embodiments of the present disclosure.
Figure 5B:
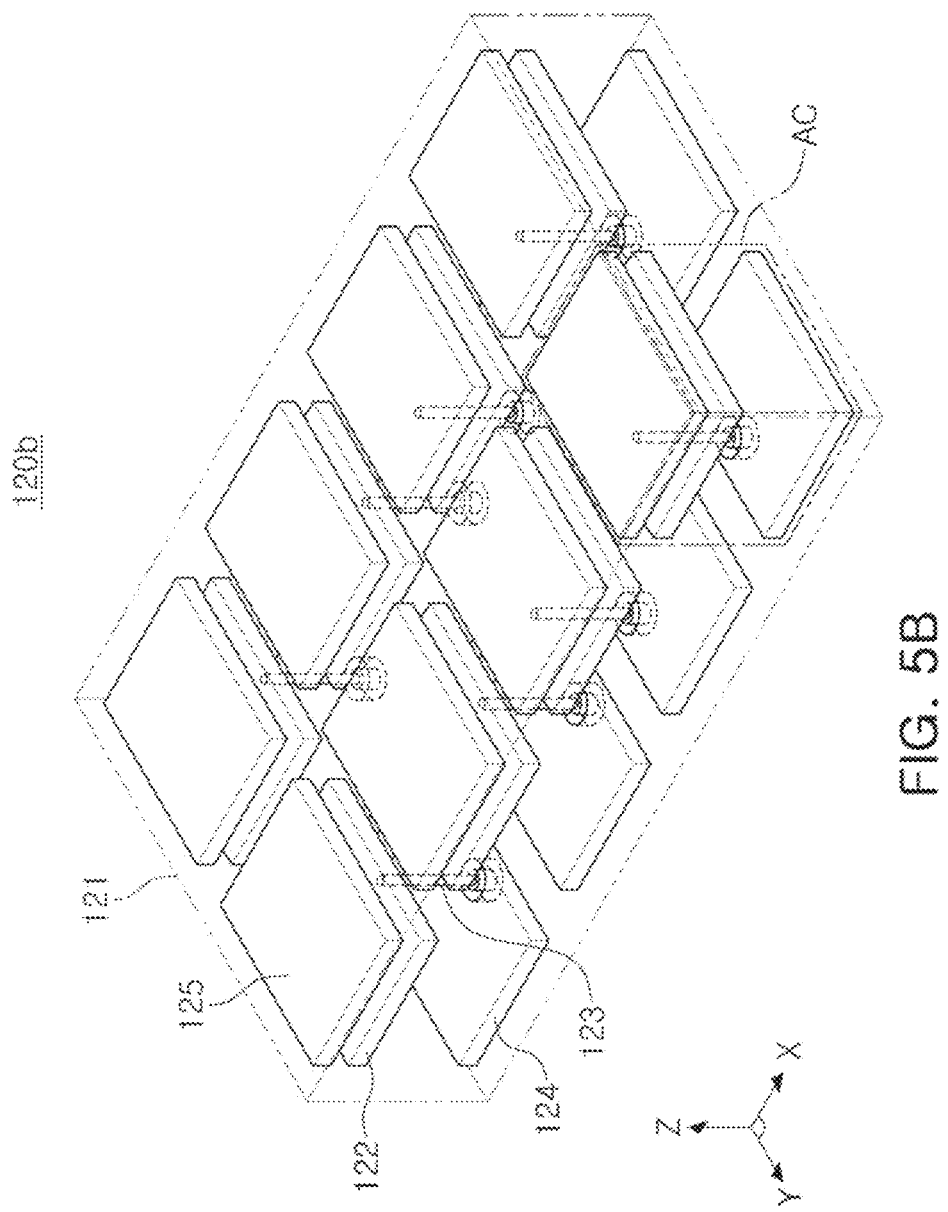
Figure 6:
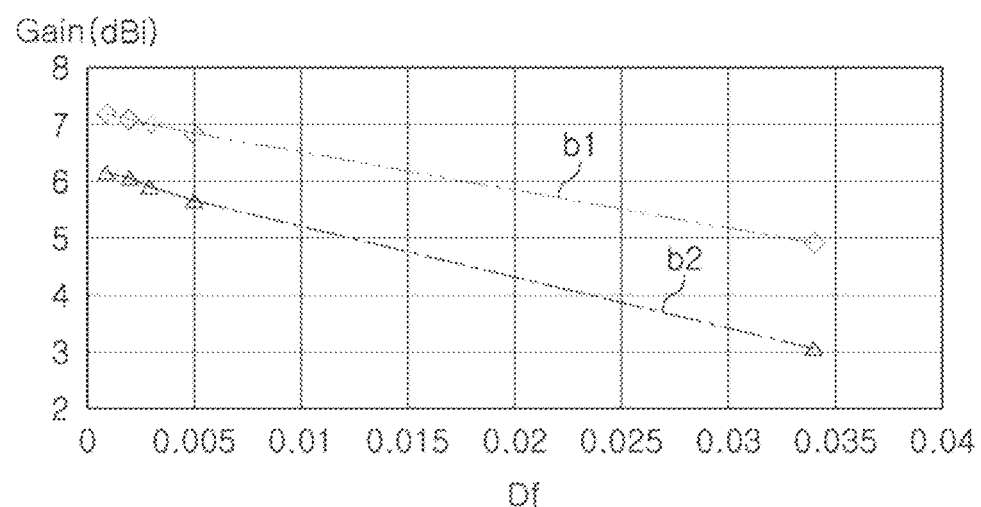
FIG. 6 is a graph illustrating an antenna gain with respect to a dielectric loss tangent (Df) depending on a dielectric constant (Dk)

FIGS. 5A and 5B are perspective diagrams illustrating an example of antenna structures 120a and 120b according to example embodiments. FIG. 6 is a graph illustrating an antenna gain with respect to a dielectric loss tangent (Df) depending on a dielectric constant (Dk). FIG. 6 is a graph illustrating changes in antenna gain with respect to the dielectric loss tangent (Df) at the dielectric constants (Dk) of 3.4 and 7.8 (under the condition in which the frequency is about 28 GHz, the impedance is about 50Ω, and the thickness of the dielectric layer is about 300 μm).

Referring to FIGS. 5A to 6, the antenna structures 120a and 120b may have a first surface S1, a second surface S2 disposed opposite to the first surface S1, and a side surface 110S disposed between the first surface S1 and the second surface S2, and may include a dielectric layer 121, an antenna member 122 surrounded by the dielectric layer 121 and configured to transmit or receive an RF signal, a connection via 123 penetrating the dielectric layer 121 and connecting the antenna member 122 to the transmission line FL (in FIG. 2), and a ground member 124 surrounding the lower portion of the connection via 123. As an example, the antenna structures 120a and 120b may be formed using a firing process, such as, for example, using low temperature cofired ceramics (LTCC), but the method of forming the antenna structures 120a and 120b is not limited to any particular method.

The dielectric layer 121 may be formed of a material having a dielectric constant (Dk) greater than that of the insulating layer 141 and the first and second encapsulants 131 and 132 of the redistribution structure 140. As illustrated in FIG. 6, materials having the same dielectric constant (Dk) may have a relatively low dissipation factor (Df), and accordingly, an antenna gain dBi may increase. Graph b1 in FIG. 6 indicates a difference in antenna gain according to the dielectric loss tangent (Df) of materials having a dielectric constant (Dk) of 3.4, and graph b2 in FIG. 6 indicates a difference in antenna gain according to the dielectric loss tangent (Df) of materials having a dielectric constant (Dk) of 7.8. Similarly, in the antenna structures 120a and 120b in some example embodiments, a material such as glass, ceramic, and silicon having a dielectric constant (Dk) of about 6 or more and a dielectric loss tangent (Df) of about 0.005 or less may be included as the dielectric layer 121. For example, the dielectric layer 121 may have a dielectric constant (Dk) in a range of about 6 to about 10, about 6 to about 9, and about 6 to about 8, and a dielectric loss tangent (Df) in a range of about 0.001 to about 0.005, about 0.001 to about 0.004, about 0.001 to about 0.003, or about 0.001 to about 0.0025. The greater height and/or width of the dielectric layer 121 may be more advantageous in terms of securing antenna performance, but may be disadvantageous in terms of miniaturization of the antenna structure 120. In example embodiments, by forming a transmission line FL (in FIG. 2) using a photolithography process on the antenna structures 120a and 120b, a material having a high dielectric constant may be used as the dielectric layer 121 of the antenna structure 120 without a limitation in forming a fine wiring. Accordingly, the size of the antenna structures 120a and 120b may be reduced while securing antenna performance.

The antenna member 122 may transmit or receive an RF signal, and may be connected to the transmission line FL (in FIG. 2) through a connection via 123. Due to the length of the connection via 123 and the thickness of the dielectric layer 121, the boundary conditions for operation of transmission/reception of the RF signal of the antenna member 122 may be designed without a limitation, and unnecessary boundary conditions (e.g., interlayer spacing, interlayer insertion, and/or the like) may be removed. Accordingly, the connection via 123 and the dielectric layer 121 may provide boundary conditions (e.g., a small manufacturing tolerance, a short electrical length, a smooth surface, a large free space, and dielectric constant adjustment, and/or the like) advantageous to operation of transmission/reception of the RF signal of the antenna member 122, thereby improving performance of the antenna structure 120. The number of antenna members 122 may vary depending on a bandwidth design standard or a size design standard of the antenna structure 120.

The ground member 124 may be disposed in the dielectric layer 121 to surround the lower portion of the connection via 123, and the lower surface of the ground member 124 may be coplanar with the lower surface of the dielectric layer 121. The ground member 124 may have a plate shape, may be disposed on the lower surface of the antenna structure 120a, and may improve isolation of the antenna members 122. In example embodiments, the ground member 124 may extend to the lower surface and also to the side surface of the antenna structure 120a and may provide a boundary condition for transmission and reception of the RF signal of the antenna member (see FIG. 5A).

In example embodiments, the ground member 124 may include a plurality of plates spaced apart from each other, and the antenna structure 120b may include a plurality of antenna cells AC corresponding to each ground member 124. The ground member 124 may improve isolation of the antenna cell AC, and may extend to the lower surface and also to the side surface of the antenna cell AC and may provide a boundary condition for transmission and reception of the RF signal of the antenna member (see FIG. 5B).

Also, the antenna structure 120 may further include a director member 125 disposed on the antenna member 122. The director member 125 may provide a boundary condition such that the bandwidth of the corresponding antenna member 122 may expand. For example, the number of director members 125 may be zero or two or more depending on the bandwidth design standard or size design standard of the antenna structure 120. The number of layers on which the director member 125 is formed is not limited to one. The antenna member 122 and the director member 125 may have various planar shapes, such as a rectangular shape or a circular shape. In the drawing, the director member 125 may be coplanar with the first surface S1 of the antenna structure 120, but the director member 125 may be embedded in the dielectric layer 121 and may be spaced apart from the first surface S1.

Figure 7:
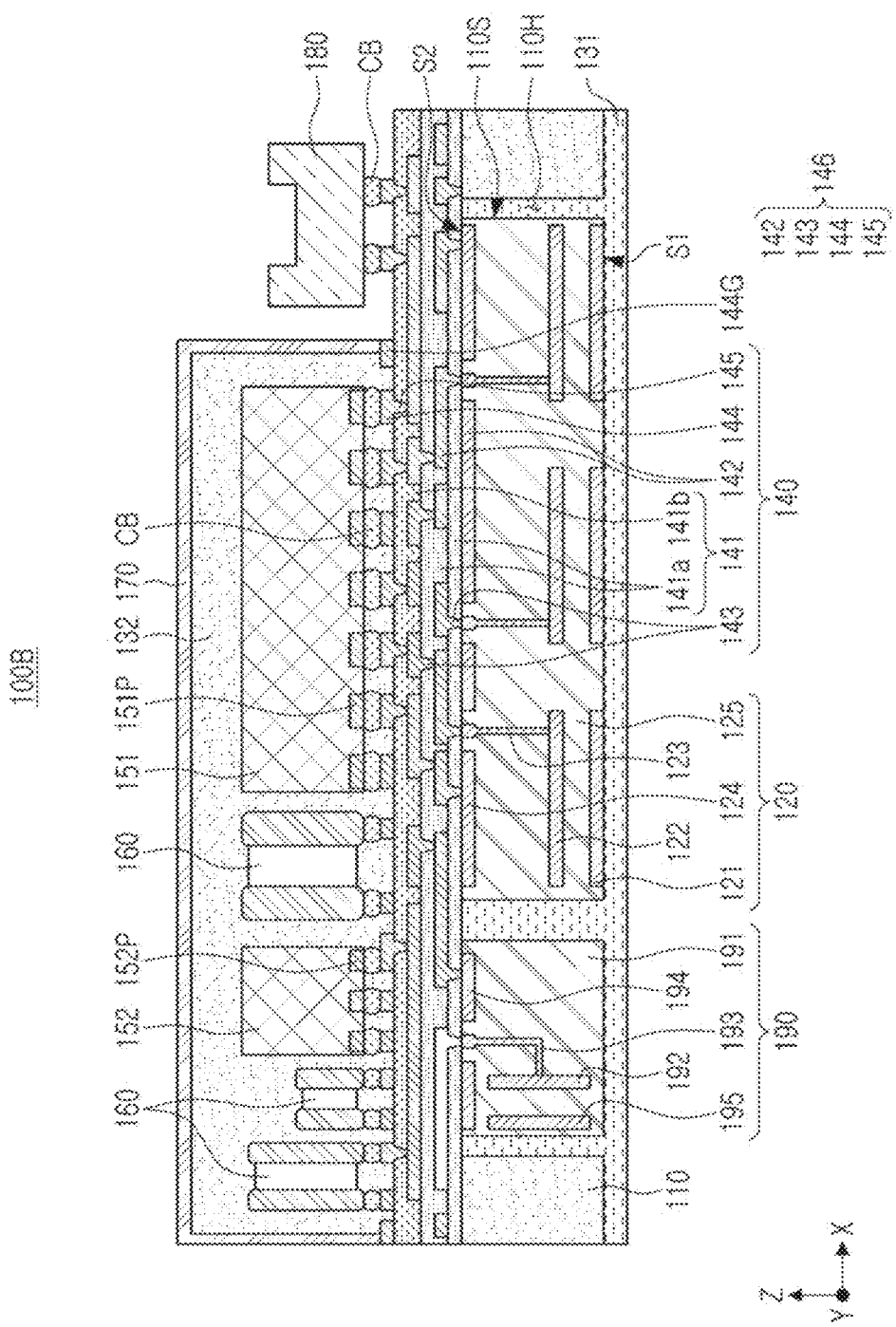
FIG. 7 is a cross-sectional diagram illustrating a semiconductor package according to example embodiments of the present disclosure.

FIG. 7 is a cross-sectional diagram illustrating a semiconductor package according to example embodiments.

Referring to FIG. 7, a semiconductor package 100B in example embodiments may be configured the same as or similarly to the aforementioned example embodiments described with reference to FIGS. 1A to 6, other than the configuration in which the semiconductor package 100B may further include a side antenna structure 190 disposed in the fan-out area FO, encapsulated by the first encapsulant 131, and configured to transmit and receive signals (e.g., signals of a band different from that of the antenna member 122) in a direction opposite to the side surface 120S of the antenna structure 120. The side antenna structure 190 may include elements corresponding to elements of the antenna structure 120, respectively, such as, for example, a dielectric layer 191, a side antenna member 192, a connection via 193, a ground member 194, and a side director member 195. The side antenna member 192 and the side director member 195 may be configured to transmit and receive signals in a lateral direction of the semiconductor package 100B. The ground member 194 of the side antenna structure 190 may improve isolation of the side antenna member 192. The position and shape of the ground member 194 is not limited to any particular examples, and the ground member 194 may be formed to surround the connection via 193 or to be parallel to the side antenna member 192, differently from the example illustrated in the drawings. In example embodiments, the side antenna structure 190 and the antenna structure 120 may be disposed in a through-hole 110H, but in example embodiments, the side antenna structure 190 and the antenna structure 120 may be disposed separately in the corresponding through-holes, respectively. In example embodiments, the side antenna structure 190 may include an antenna pattern in which a signal has a band and a radiation plane different from those of the antenna structure 120, and the structure and shape thereof are not limited to the example illustrated in FIG. 7.

Figure 8:
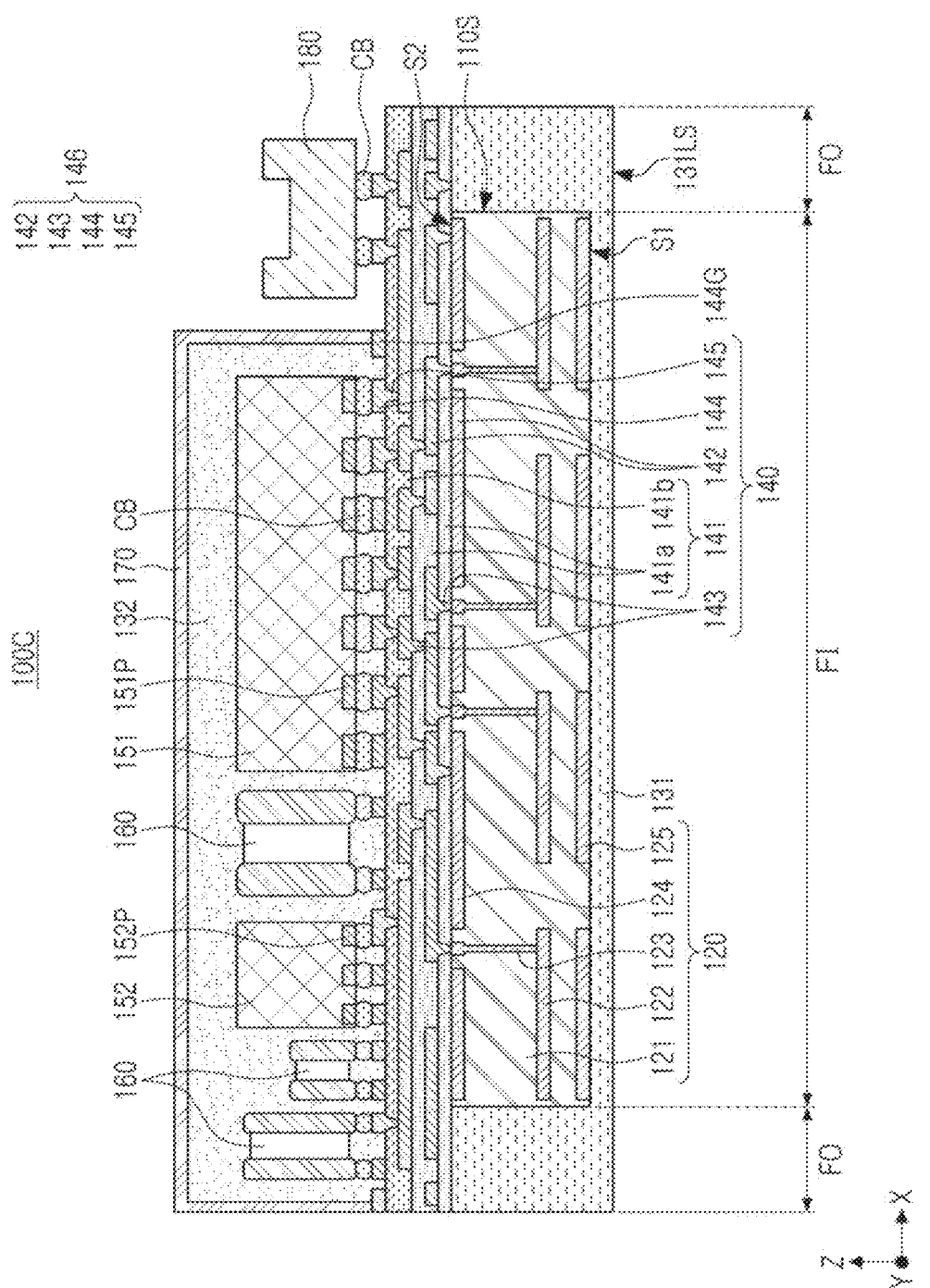
FIG. 8 is a cross-sectional diagram illustrating a semiconductor package according to example embodiments of the present disclosure.

FIG. 8 is a cross-sectional diagram illustrating a semiconductor package according to example embodiments.

Referring to FIG. 8, a semiconductor package 100C in example embodiments may be configured the same as or similarly to the aforementioned example embodiments described with reference to FIGS. 1A to 7, other than the configuration in which the frame 110 (in FIG. 1A) around the antenna structure 120 is not provided. In the semiconductor package 100C in example embodiments, the transmission line disposed between the antenna structure 120 and the first semiconductor chip 151 may be formed as the redistribution conductor 146 having a fine pitch, such that transmission loss of a high frequency signal may be reduced. The redistribution structure 140 disposed on the second surface S2 of the antenna structure 120 may have a fan-in area FI overlapping the antenna structure 120 in a direction (Z axis direction) perpendicular to the second surface S2 and a fan-out area FO extending to an external side of the fan-in area FI. In example embodiments, the lower surface 131LS of the first encapsulant 131 may be planarized by a polishing process, and a thickness of the first encapsulant 131 covering the first surface S1 of the antenna structure 120 may be appropriately adjusted.

Figure 9:
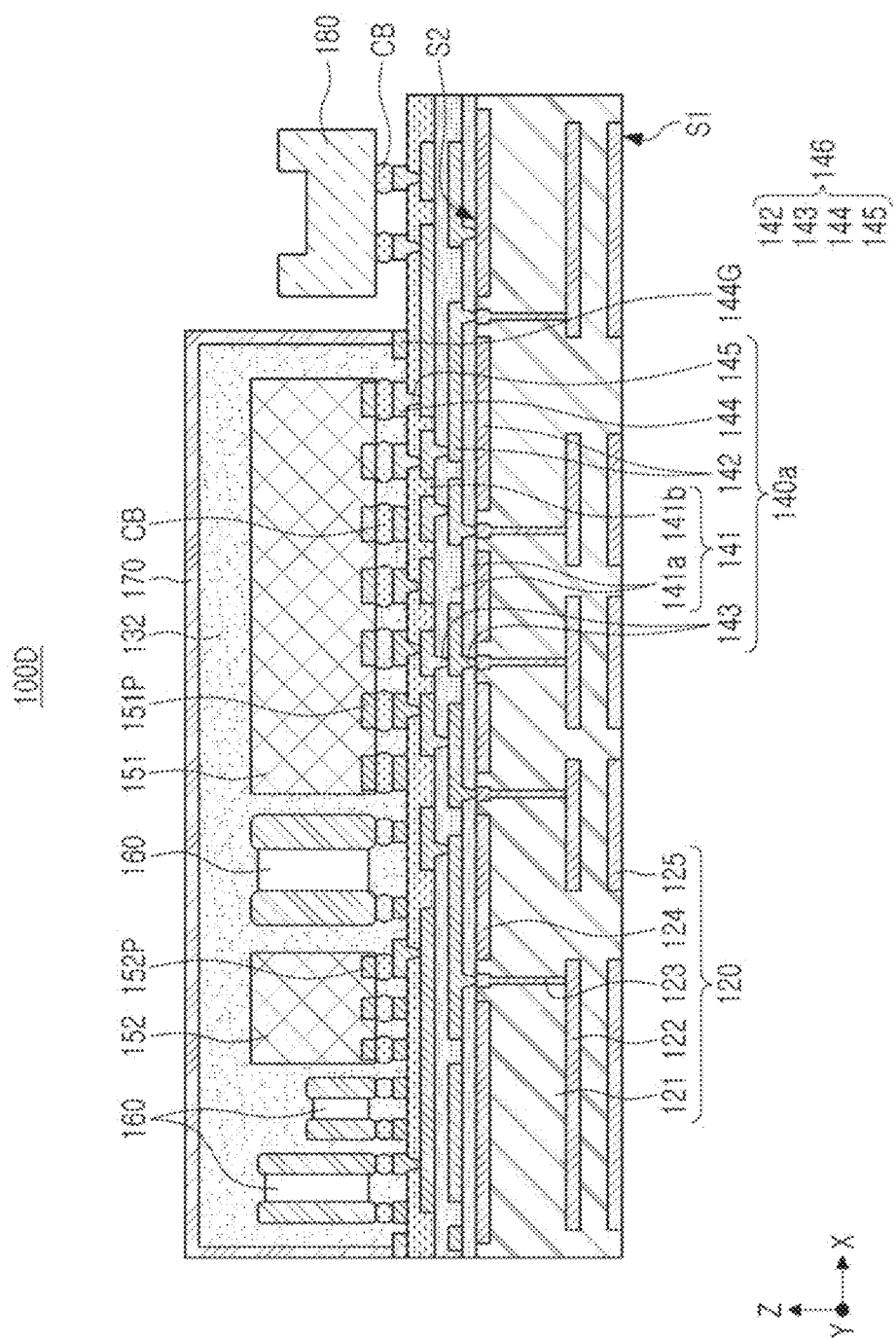
FIG. 9 is a cross-sectional diagram illustrating a semiconductor package according to example embodiments of the present disclosure.

FIG. 9 is a cross-sectional diagram illustrating a semiconductor package 100D according to example embodiments.

Referring to FIG. 9, a semiconductor package 100D in example embodiments may be configured the same as or similarly to the aforementioned example embodiments described with reference to FIGS. 1A to 7, other than the configuration in which the semiconductor package 100D includes a redistribution structure 140a having the same width as that of the antenna structure 120 on the XY plane. In example embodiments, the semiconductor package 100D may have a fan-in package form. When the width or the planar area of the antenna structure 120 is sufficient to mount the first and second semiconductor chips 151 and 152, the passive devices 160, and the connector 180 thereon, the redistribution structure 140a may be configured to have a size corresponding to the second surface S2 of the antenna structure 120. In some example embodiments, improved performance of the antenna structure 120 may be secured as compared to other example embodiments, and by forming the transmission line disposed between the antenna structure 120 and the first semiconductor chip 151 as the redistribution conductor 146 of a fine pitch, transmission loss of the high-frequency signal may be reduced.

FIGS. 10A to 10E are cross-sectional diagrams illustrating processes of manufacturing the semiconductor package 100A illustrated in FIG. 1A in order.

Referring to FIG. 10A, a frame 110 and an antenna structure 120 may be attached to a first carrier C1, and a first encapsulant 131 for encapsulating the aforementioned elements may be formed. The first carrier C1 may include an adhesive tape for fastening and supporting the frame 110 and the antenna structure 120, and losing adhesiveness by ultraviolet (UV) irradiation, for example. The frame 110 may have a through hole 110H in which the antenna structure 120 is accommodated, and may be formed of an insulating material such as prepreg, for example. The antenna structure 120 may have a first surface S1 to which an RF signal is radiated and a second surface S2 on which the ground member 124 is disposed, and the second surface S2 may be disposed to oppose the first carrier C1. The first encapsulant 131 may be formed by applying or compressing an insulating material, such as, for example, ABF, on the first carrier C1 and curing the insulating material. The frame 110 may secure the thickness uniformity of the first encapsulant 131 such that the thickness of the first encapsulant 131 may be reduced. For example, the frame 110 may have the same or substantially the same height as that of the antenna structure 120. Thereafter, the first carrier C1 may be removed, and the antenna structure 120 may be inverted and may be disposed on the second carrier C2 in FIG. 10B.

Referring to FIG. 10B, the frame 110 and the antenna structure 120 may be disposed on the second carrier C2, and the built-up insulating layer 141a, the redistribution pattern 142 and/or the redistribution via 143 may be formed. The antenna structure 120 may be disposed such that the first surface S1 covered by the first encapsulant 131 may be disposed to oppose the second carrier C2. The built-up insulating layer 141a may be formed by applying and curing a photosensitive resin such as PID, for example. The redistribution pattern 142 and the redistribution via 143 may be formed using a photolithography process, a plating process, an etching process, and/or the like. The redistribution pattern 142 and the redistribution via 143 may include a metal material such as copper (Cu). The redistribution pattern 142 and the redistribution via 143 may be configured to be electrically connected to the connection via 123 and the ground member 124 of the antenna structure 120.

Figure 10C:
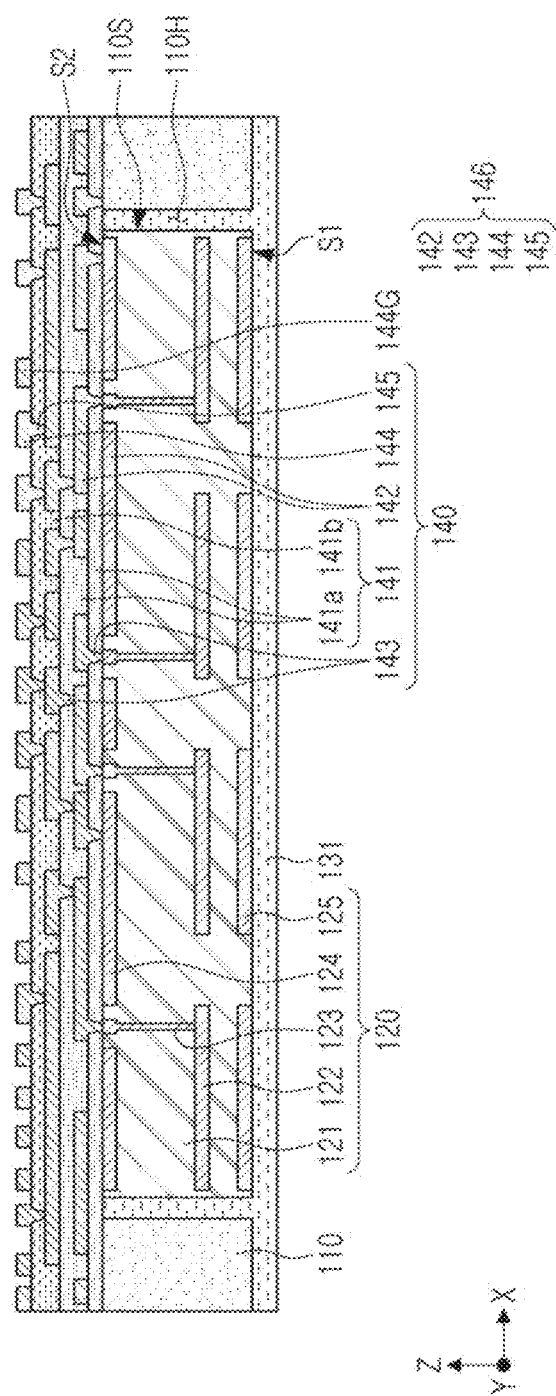

Referring to FIG. 10C, the outermost insulating layer 141b, the UBM pad 144, and the UBM via 145 may be formed. The outermost insulating layer 141b may be formed by applying and curing ABF, for example, on the built-up insulating layer 141a. The UBM pad 144 and the UBM via 145 may be formed using an etching process, a plating process, and/or the like. For example, the UBM via 145 may be formed by plating a metal material such as copper (Cu) in the via hole of the outermost insulating layer 141b formed using a laser drill. In example embodiments, the outermost insulating layer 141b may include the same photosensitive resin as that of the built-up insulating layer 141a, and in some example embodiments, surface roughness of the UBM pad 144 may be formed more finely. The UBM via 145 may be configured to be connected to the pad portion 142P (in FIG. 4A) of the redistribution pattern 142.

Figure 10D:
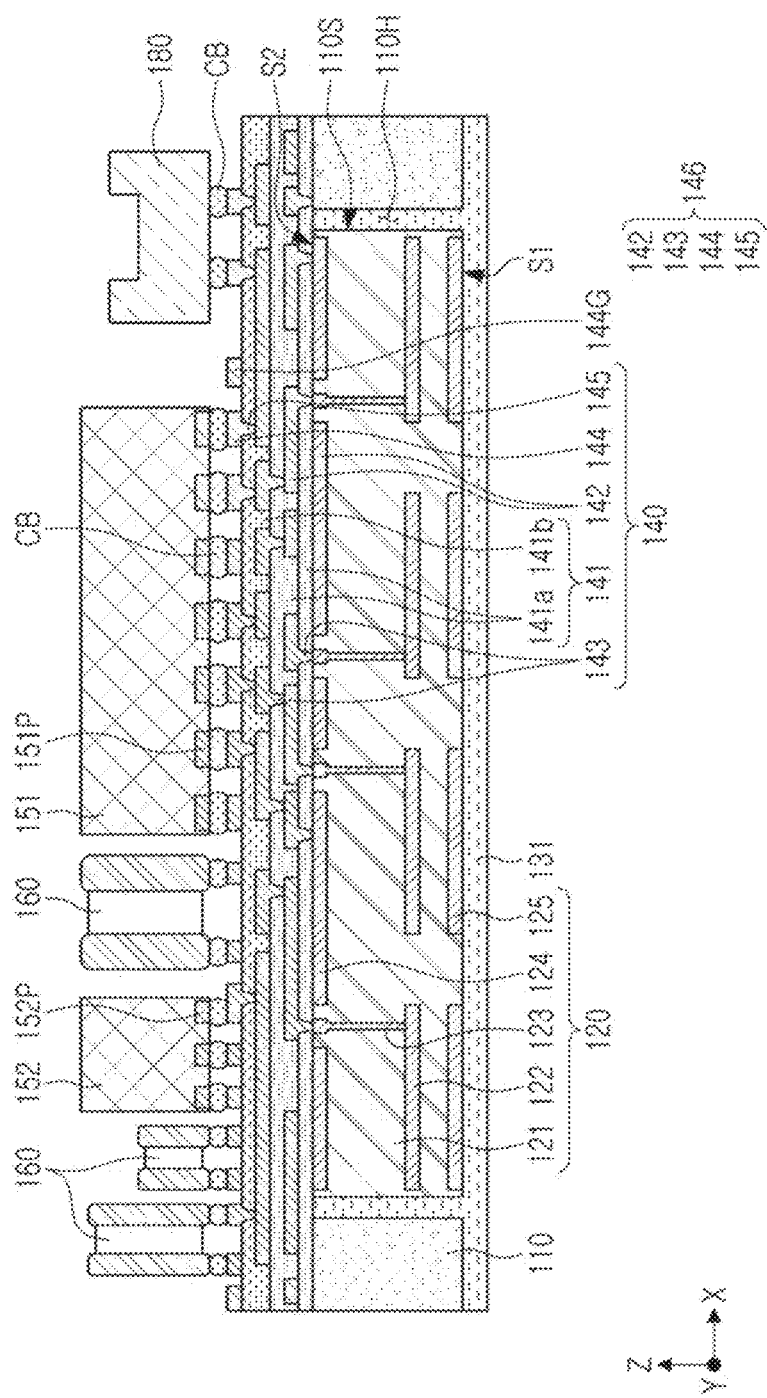

Referring to FIG. 10D, the first and second semiconductor chips 151 and 152, the plurality of passive devices 160, and the connector 180 may be mounted on the completed redistribution structure 140. The first and second semiconductor chips 151 and 152, the plurality of passive devices 160, and the connector 180 may be electrically connected to the redistribution conductor 146 through the connection bumps CB. The first semiconductor 151 may be configured as an RFIC chip, and the second semiconductor chip 152 may be configured as a PMIC chip. The plurality of passive devices 160 may include a capacitor, an inductor, a chip resistor, and/or the like. The connector 180 may have a structure for connection of a cable (e.g., a coaxial cable, a flexible PCB). As described above, in example embodiments, by directly forming the redistribution structure 140 on the antenna structure 120 using a fine wiring process, transmission loss of an RF signal may be reduced between the first semiconductor chip 151 and the antenna member 122.

Figure 10E:
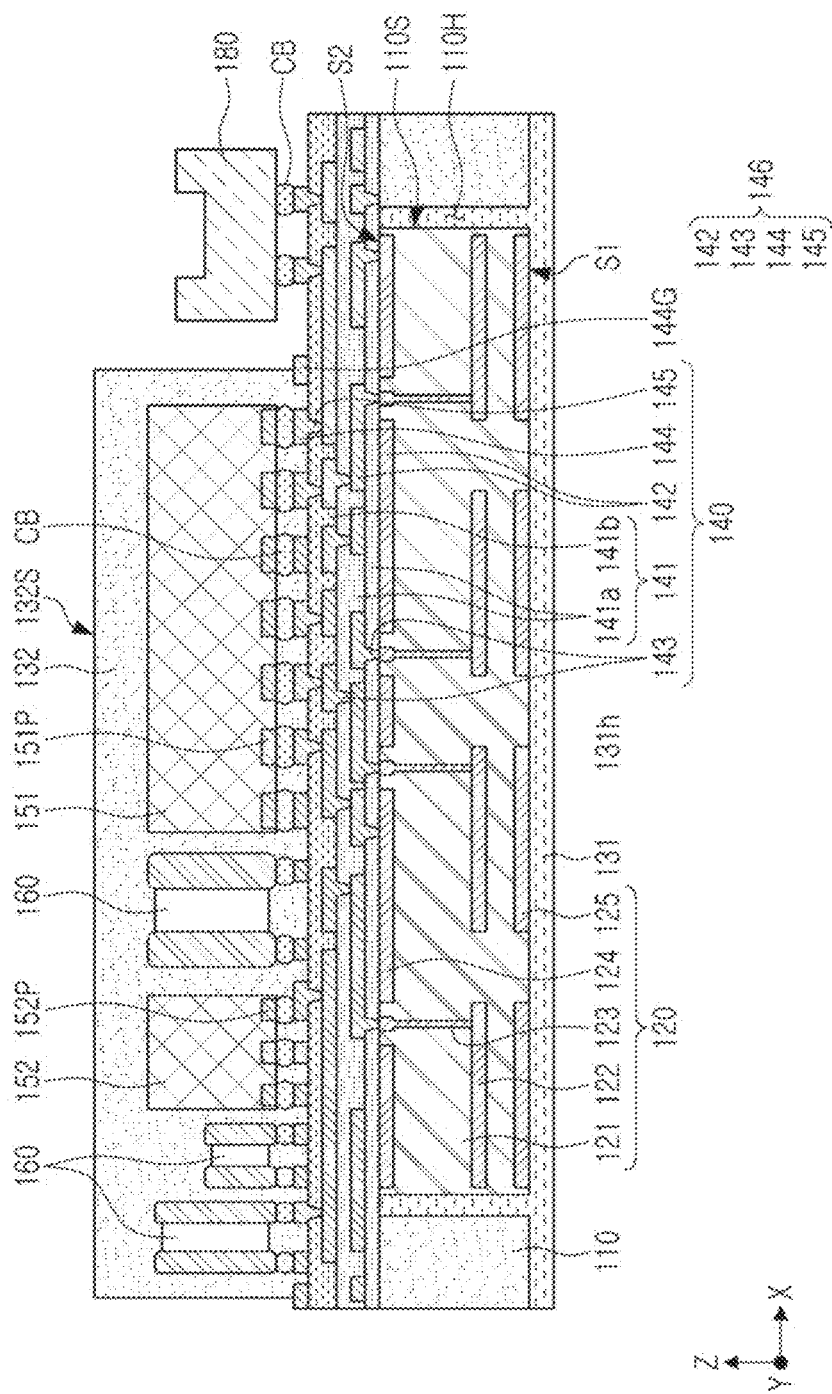

Referring to FIG. 10E, a second encapsulant 132 for encapsulating the first and second semiconductor chips 151 and 152 and the plurality of passive devices 160 may be formed. The second encapsulant 132 may be formed by locally applying and curing an insulating material for molding, such as, for example, EMC. In an example, the second encapsulant 132 may include an insulating material different from that of the first encapsulant 131, but example embodiments thereof are not limited thereto. The second encapsulant 132 may be formed to expose at least a portion of the ground pattern 144G. Thereafter, a shielding layer 170 (in FIG. 1A) may be formed on the surface 132S of the second encapsulant 132. The shielding layer 170 may be formed to be in contact with the ground pattern 144G, and may be electrically connected to the ground pattern of the redistribution conductor 146. The shielding layer 170 (in FIG. 1A) may include a metal material such as SUS, and may be formed by masking the connector 180 and performing a sputtering process, for example. As described above, in example embodiments, by directly forming the redistribution structure 140 on the antenna structure 120 using a photolithography process, a semiconductor package in which the length of the transmission line of the RF signal and transmission loss are reduced may be provided.

Figure 11:
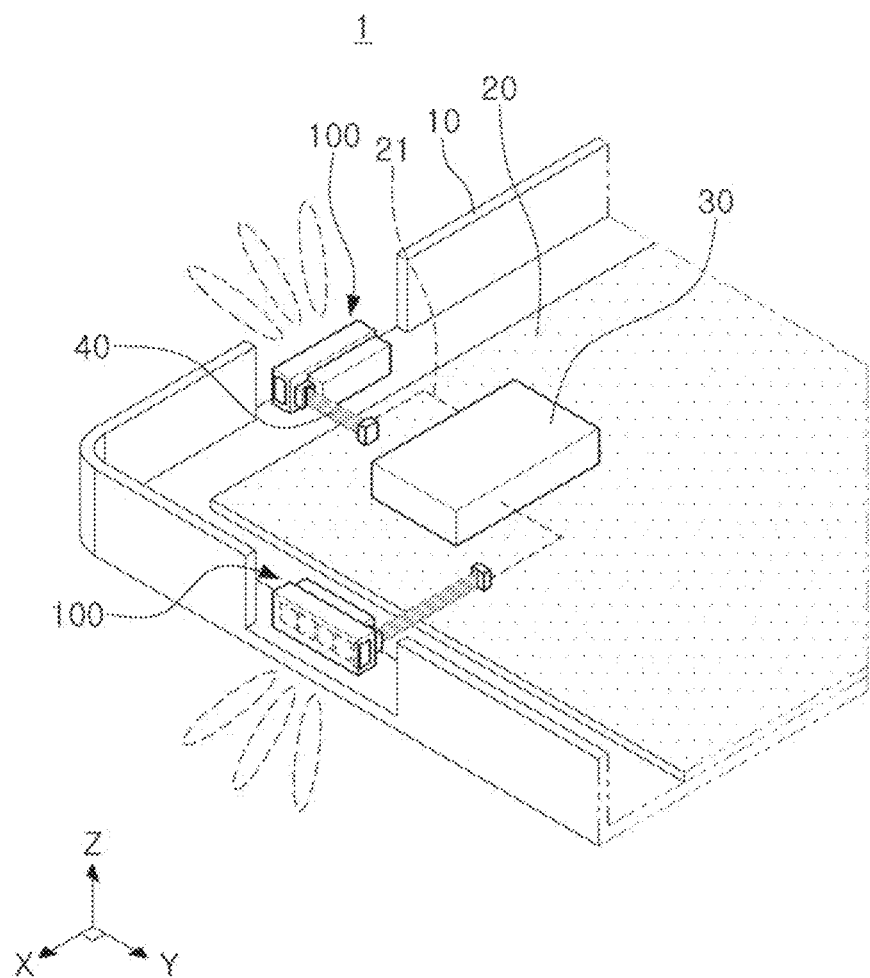
FIG. 11 is a diagram illustrating a state in which a semiconductor package is mounted on an electronic device according to example embodiments of the present disclosure.

FIG. 11 is a diagram illustrating a state in which a semiconductor package 100 is mounted on an electronic device 1 according to example embodiments.

Referring to FIG. 11, an electronic device 1 may include a set cover 10, a board 20, and/or a third semiconductor chip 30. The electronic device 1 may be implemented as, for example, a smart phone, a personal digital assistant, a digital video camera, a digital still camera, a network system, a computer, a monitor, a tablet, a laptop, a netbook, a television, a video game, a smart watch, an automotive, and/or the like. However, example embodiments thereof are not limited thereto, and in addition to the above example, the electronic device 1 may be implemented as a different electronic device processing a high-frequency signal.

The set cover 10 may accommodate the board 20 and may have a slot in which the semiconductor package 100 is mounted. The board 20 may be configured as, for example, a printed circuit board on which the third semiconductor chip 30 is mounted, and may include a connection wire 21 electrically connecting the cable 40 to the third semiconductor chip 30. The cable 40 may include, for example, a coaxial cable, a flexible PCB, and/or the like.

The third semiconductor chip 30 may include a logic chip such as a central processing unit, a graphics processing unit, a field programmable gate array (FPGA), a digital signal processor (DSP), a cryptographic processor, a microprocessor, a microcontroller, an analog-to-digital converter, an application-specific integrated circuit (ASIC), an application processor (AP), a baseband processor, (BP), and/or the like. For example, the third semiconductor chip 30 may be configured as a BP chip, and may transmit a low-frequency signal to the RFIC chip 151 (in FIG. 1A) of the semiconductor package 100 or may receive and process a modulated low-frequency signal by the RFIC chip 151 (in FIG. 1A).

The semiconductor package 100 may be configured to have the form of the semiconductor packages 100A, 100B, 100C, and 100D described with reference to FIGS. 1A to 9 or a combination thereof. The semiconductor package 100 may be fixed in the set cover 10 such that the set cover 10 may transmit and receive a high-frequency signal in an external side direction, and may be electrically connected to the connection wiring 21 of the board 20 through the cable 40. As described above, the semiconductor package 100 in example embodiments may be disposed in an outer region of the electronic device 1 and may be configured to transmit and receive a high-frequency signal (e.g., an RF signal).

According to the aforementioned example embodiments, by forming the transmission line disposed between the antenna and the RFIC with a fine pattern, a semiconductor package in which a transmission loss between the antenna and the RFIC is reduced may be provided.

One or more of the elements disclosed above may include or be implemented in one or more processing circuitries such as hardware including logic circuits; a hardware/software combination such as a processor executing software; or a combination thereof. For example, the processing circuitries more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be apparent to those skilled in the art that modifications and variations could be made without departing from the scope of the present disclosure as defined by the appended claims.

What is claimed is:
1. A semiconductor package, comprising:
an antenna structure having a first surface, a second surface opposite to the first surface, and a side surface between the first and second surfaces, and including a dielectric layer, an antenna member configured to transmit and receive a signal through the first surface in the dielectric layer, a connection via extending from the antenna member toward the second surface, and a ground member adjacent to the second surface in the dielectric layer, and spaced apart from the antenna member and the connection via;
a frame surrounding the side surface of the antenna structure;
a first encapsulant covering at least a portion of the antenna structure and the frame;
a redistribution structure on the second surface and including an insulating layer in contact with the antenna structure and the frame, and a redistribution conductor configured to be electrically connected to the ground member and the connection via in the insulating layer;
a first semiconductor chip on the redistribution structure and electrically connected to the antenna member through the redistribution conductor;
a second encapsulant encapsulating the first semiconductor chip on the redistribution structure; and
a shielding layer surrounding a surface of the second encapsulant.
2. The semiconductor package of claim 1,
wherein the redistribution conductor includes a redistribution pattern on the insulating layer and a redistribu- tion via penetrating the insulating layer and electrically connecting the redistribution pattern to the connection via, and wherein the redistribution pattern has surface roughness (Ra) of about 0.1 um or less.

3. The semiconductor package of claim 1,
wherein the redistribution conductor includes a redistribution pattern on the insulating layer and a redistribution via penetrating the insulating layer and electrically connecting the redistribution pattern to the connection via, and
wherein the redistribution via has a shape in which a side surface is tapered toward the second surface.

4. The semiconductor package of claim 1,
wherein the redistribution conductor includes a pad portion in the insulating layer and a redistribution via penetrating the insulating layer and connected to the pad portion, and
wherein a diameter of the pad portion has a ratio of about 3 or less with respect to a maximum diameter of the redistribution via.

5. The semiconductor package of claim 1, wherein the insulating layer has a dielectric constant (Dk) lower than a dielectric constant of the dielectric layer.

6. The semiconductor package of claim 1, wherein the dielectric layer has a dielectric constant of about 6 or more.

7. The semiconductor package of claim 1,
wherein the first encapsulant has a cover area covering the first surface of the antenna structure, and
wherein the cover area has a height in a range of about 10 μm to about 50 μm in a direction perpendicular to the first surface.

8. The semiconductor package of claim 1, wherein the first semiconductor chip is surface-mounted on the redistribution structure.

9. The semiconductor package of claim 8, further comprising:
a connection bump connecting the first semiconductor chip to the redistribution structure,
wherein the redistribution conductor includes a UBM pad in contact with the connection bump, a pad portion below the UBM pad, and a UBM via connecting the UBM pad to the pad portion, and
wherein the pad portion has a diameter of about 150 μm or less.

10. The semiconductor package of claim 1, further comprising:
a second semiconductor chip encapsulated by the second encapsulant on the redistribution structure and electrically connected to the first semiconductor chip through the redistribution conductor.

11. The semiconductor package of claim 10, further comprising:
a connector spaced apart from the second encapsulant and the shielding layer on the redistribution structure and electrically connected to the first and second semiconductor chips through the redistribution conductor.

12. The semiconductor package of claim 10,
wherein the first semiconductor chip includes an RFIC chip, and
wherein the second semiconductor chip includes a PMIC chip.

13. The semiconductor package of claim 10, further comprising:
a plurality of passive devices adjacent to the first and second semiconductor chips on the redistribution structure and electrically connected to the first and second semiconductor chips through the redistribution conductor.

14. The semiconductor package of claim 13, wherein the plurality of passive devices include a capacitor, an inductor, and a chip resistor.

15. A semiconductor package, comprising:
an antenna structure having a first surface, a second surface opposite to the first surface, and a side surface between the first and second surfaces, and including a dielectric layer, an antenna member configured to transmit and receive a signal through the first surface, a connection via extending from the antenna member toward the second surface, and a ground member adjacent to the second surface in the dielectric layer, and spaced apart from the antenna member and the connection via;
a redistribution structure on the second surface and including an insulating layer in contact with the antenna structure, and a redistribution conductor configured to be electrically connected to the ground member and the connection via in the insulating layer;
a first encapsulant covering the first surface and the side surface of the antenna structure;
a semiconductor chip on the redistribution structure opposite to the antenna structure and electrically connected to the redistribution conductor; and
a second encapsulant encapsulating the semiconductor chip,
wherein the redistribution structure has a fan-in area overlapping the antenna structure in a direction perpendicular to the second surface and a fan-out area extending to an external side of the fan-in area.

16. The semiconductor package of claim 15,
wherein the insulating layer includes photosensitive resin, and
wherein the dielectric layer includes ceramic.

17. The semiconductor package of claim 15, further comprising:
a side antenna structure in the fan-out area, encapsulated by the first encapsulant, and including a side antenna member configured to transmit and receive a signal in a direction perpendicular to the side surface of the antenna structure.

18. The semiconductor package of claim 15, further comprising:
a frame in the fan-out area and surrounding the side surface of the antenna structure.

19. A semiconductor package, comprising:
an antenna structure having a first surface, a second surface opposite to the first surface, and a side surface between the first and second surfaces, and including a dielectric layer, an antenna member configured to transmit and receive a signal through the first surface, a connection via extending from the antenna member toward the second surface, and a ground member adjacent to the second surface in the dielectric layer and spaced apart from the antenna member and the connection via;
a redistribution structure on the second surface and including an insulating layer on the dielectric layer, a redistribution pattern on the insulating layer, and a redistribution via penetrating the insulating layer and electrically connecting the redistribution pattern to the ground member and the antenna member;

first and second semiconductor chips on the redistribution structure opposite to the antenna structure and electrically connected to the redistribution pattern, wherein the connection via has a shape in which side surfaces opposing each other extend substantially in parallel, and wherein the redistribution via has a shape in which side surfaces opposing each other are tapered toward the second surface.

20. The semiconductor package of claim 19, wherein the redistribution pattern includes a pad portion in contact with the redistribution via, and wherein a diameter of the pad portion has a ratio of about 3 or less with respect to a maximum diameter of the redistribution via.

* * * * *